United States Patent [19]
Smith et al.

[11] Patent Number: 5,247,668
[45] Date of Patent: Sep. 21, 1993

[54] METHODS OF REALIZING DIGITAL SIGNAL PROCESSORS USING A PROGRAMMED COMPILER

[75] Inventors: Stewart G. Smith, Valbonne; Ralph W. Morgan, La Colle sur Loup; Julian G. Payne, Antibes, all of France

[73] Assignee: VLSI Technology, Inc., San Jose, Calif.

[21] Appl. No.: 987,565

[22] Filed: Dec. 8, 1992

Related U.S. Application Data

[63] Continuation of Ser. No. 425,634, Oct. 23, 1989, abandoned.

[51] Int. Cl.[5] ............................................. G06F 15/20
[52] U.S. Cl. ............................... 395/600; 364/DIG. 1; 364/221.4; 364/280 H
[58] Field of Search .................. 364/DIG. 1, DIG. 2; 395/600

[56] References Cited

U.S. PATENT DOCUMENTS

| | | | |
|---|---|---|---|
| 4,813,013 | 3/1989 | Dunn | 364/900 |
| 4,831,524 | 5/1989 | Furgerson | 364/900 X |
| 4,831,580 | 5/1989 | Yamada | 364/900 |
| 4,870,591 | 9/1989 | Ciciarelli et al. | 364/468 |
| 4,992,934 | 2/1991 | Portanova et al. | 364/200 |

*Primary Examiner*—Thomas M. Heckler
*Attorney, Agent, or Firm*—Bowles Horton

[57] ABSTRACT

A compiler for a digital signal processor allows the designer to specify separately function, accuracy and throughput. The compiler employs a word structure having the signal attributes of bits, digits and subwords which all have a direct relationship to the size of the processor and throughput. From a budget of working bits and clock cycles implicit in the specification of accuracy and throughput the compiler is able to choose the optimal word structure for the application. The compiler can also propagate throughout an icon network, used for the specification of function, various estimation attributes such as word growth and quantisation noise, which allow the designer to observe the effect of design changes without recourse to simulation. A specific example of design employing a specified architecture and a specified computational grain is explained.

21 Claims, 6 Drawing Sheets

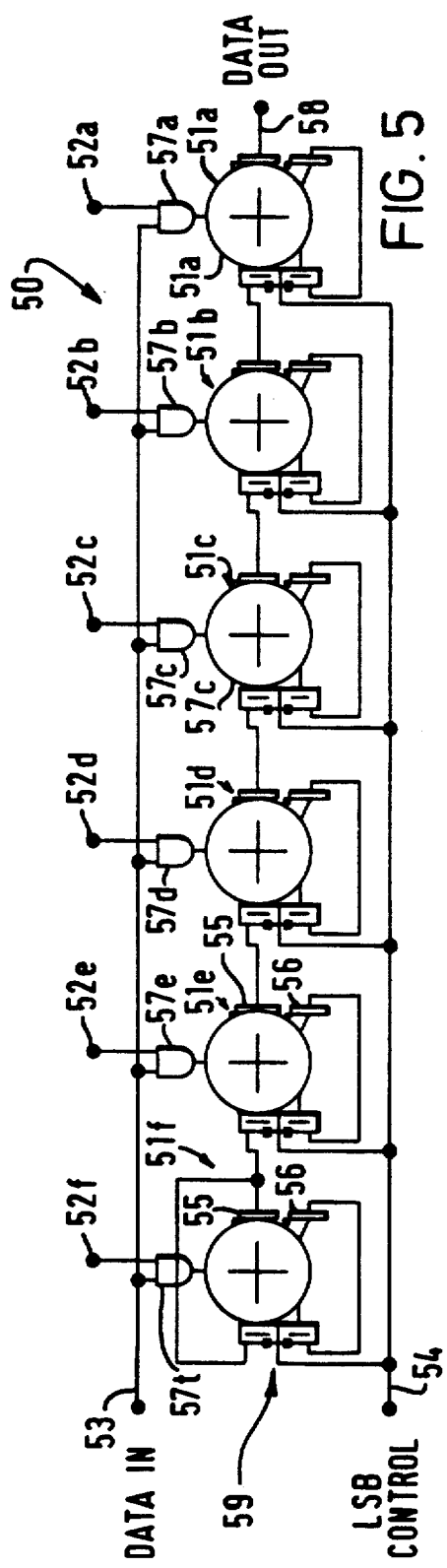
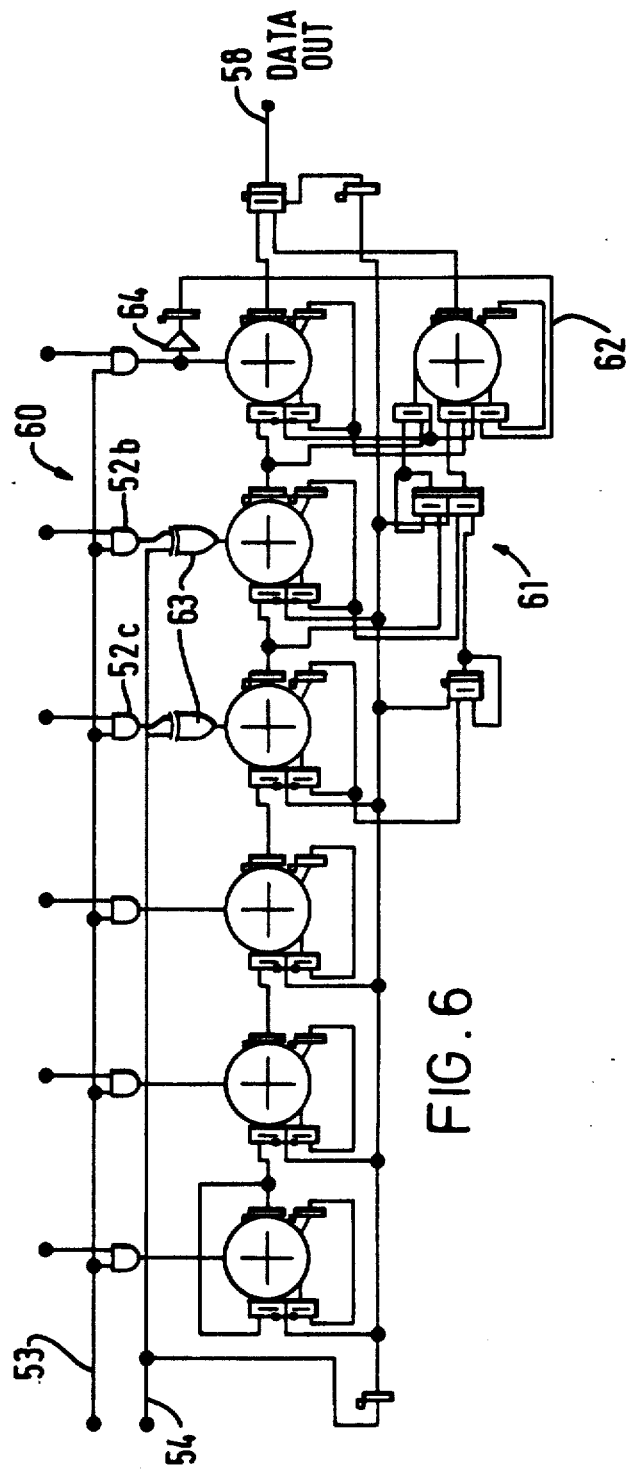

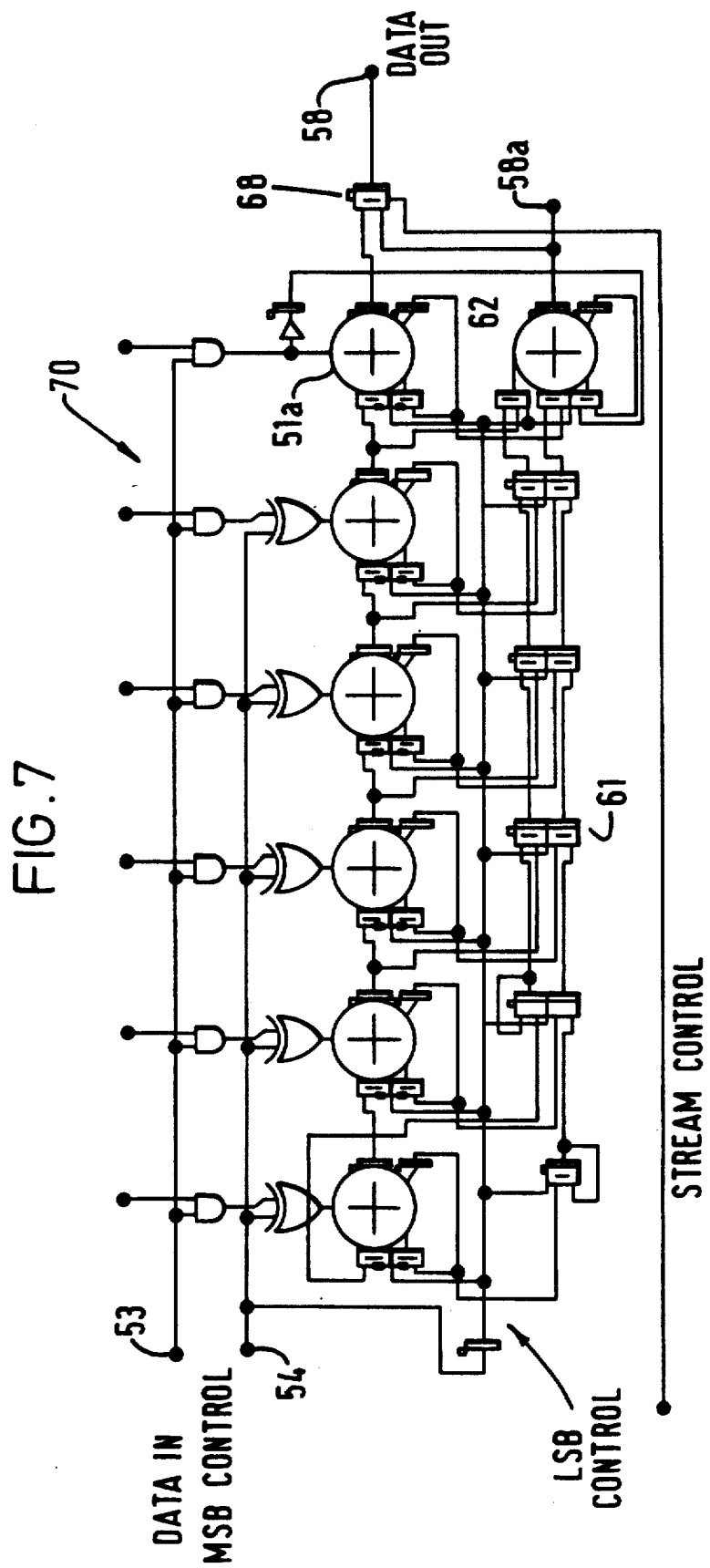

METHODS OF REALIZING DIGITAL SIGNAL PROCESSORS USING A PROGRAMMED COMPILER

This application is a continuation of application Ser. No. 07/425,634, filed Oct. 23, 1989, now abandoned.

BACKGROUND OF THE INVENTION

The present invention concerns the design and fabrication of large scale integrated circuits with the aid of a programmed data processor, hereinafter called compiler, by means of which an operator initially specifies a function and achieves a detailed instruction for the layout of a large scale integrated circuit which implements, in the selected technical realisation, the function which has been specified by the operator. The invention more particularly relates to improved techniques for the programming and operation of such a compiler.

The design, checking and testing of large scale integrated circuits is so complex that the use of such a programmed data processor is essential for any normal circuit or function. This is partly because the digital signal processing functions are inherently complicated, partly because the main data processing functions need to be decomposed into simpler functions which are within the library of the processor and partly because considerable computation is required in order to achieve an efficient layout of the network. It will be understood that the result of the computerised design process is a detailed specification defining, in terms of a particular technology, a complex integrated circuit. Such a specification may be regarded as a template for the fabrication of the physical embodiment of the integrated circuit.

Compilers of the kind set forth above are commercially available and have been described in the literature. Reference may be made for example to Rabaey et al. "Cathedral—2: Computer Aided Synthesis of Digital Signal Processing Systems", Proceedings of the IEEE CICC 1987 pages 157-160 (1987), S. G. Smith and R. W. Morgan "High Level DSP ASIC Design Tool", Proceedings Euro—ASIC 1989 pages 117-129, Grenoble, France, January 1989; Hartley et al., "A Digit—Serial Silicon Compiler" Proceedings 25th ACM/IEEE DA Conference pages 646-649, California, June 1988; Proceedings of the 24th Design Automation Conference, Miami, Fla., June 1987; Proceedings of the International Workshop on Logic and Architectural Synthesis for Silicon Compilers, Grenoble, May 1988; Proceedings of the International Conference on Computer Aided Design, Santa Clara, Calif., November 1988; and IEEE Transactions on Computer Aided Design on Integrated Circuits and Systems, Volume CAD-5 Number 4, October 1986.

As an example of the complexity of the circuits which are realized with the aid of such compilers, a sixteen bit discrete cosine transform circuit which is described later and comprises twenty five digital adders, twenty five digital subtractors, two multipliers and eleven digital rotators, requires for its full specification about seventy pages or more of schematic diagrams when expressed in detailed circuit form. It is not feasible to design circuits of such complexity by hand within any reasonable time. An added factor in the need to employ computer aided design is constituted by a multiplicity of other requirements, including the achieving of efficient utilization of area in the layout of the integrated circuit and, particularly for digital signal processing, the optimization of throughput.

SUMMARY OF THE INVENTION

INTRODUCTION

The reader will be presumed to be familiar with the programming and use of a compiler of the general kind or kinds set forth in the references mentioned above.

The general object of the present invention is to provide improved techniques for the programming and operation of a compiler which accepts, usually by means of operator-selectable and operator-controllable icons, the specification of a function of a complexed digital signal processing circuit and which proceeds to generate a netlist or similar detailed specification of a large scale integrated circuit representing a realisation of the functions selected by the operator. The compiler, as well as being capable of translating a high level description of a digital signal processor into a physical realisation, is intended to be capable of displaying the behaviour of the specified system in terms of propagated data values and estimates of physical and numerical quantities at a multiplicity of points in the processor.

HIGH LEVEL DESCRIPTION

One aspect of the present invention concerns the ability of the designer to specify, separately, the desired function, to the required accuracy and at the required rate or throughput. These three requirements may be set at a high level in a simple schematic. Functional icons may be provided for basic objects, such as multiply, add, subtract, and accummulate. A configuration of these icons into an icon network fulfils the requirement for specifying function. The assignment of values to the precisions of input and output operands and to the internal working word allows the activation of synthesis procedures. From these procedures, the data outputs of icons inherit a small set of word attributes, which define the local numerical format throughout the network of icons. The purpose of this is to fulfil the requirement of specified accuracy. The final requirement may be met by a single, global attribute known as 'taskrate'.

WORD STRUCTURE

Another aspect of the invention concerns an improved word structure for use in the compiler. A compiler automatically synthesizes high performance signal processors with arbitrary degrees of parallelism and pipelining. All the complex architectural features which are inherent in extensively pipelined or parallel processors may, in accordance with known practice, be treated automatically by the compiler but in order to achieve, automatically, design compromises affecting size, throughput and power consumption of the processor, the designer should be able to control these parameters.

For this purpose the compiler employs a word structure having three signal attributes, namely bits, digits and subwords, that describe the physical structure of a data word. These attributes all have a direct relationship to the size of the processor, mainly expressed in terms of the area of silicon substrate employed, and throughput and accordingly provides the system with all the information necessary to synthesize the processor. From the budget of working bits and clock cycles implicit in the specification of accuracy and throughput, the compiler is able to choose the optimal word structure for the application.

WORD GROWTH

Another aspect of the invention concerns the problem of word growth in a digital signal processor which is realised by means of a compiler. The possibility of a numerical overflow, at some point in the synthesized processor, is an ever-present problem, particularly when using fixed-point number systems. Word growth can be absolute, with respect to the bottom of a word, and relative, namely growth with respect to the binary point. This aspect of the invention concerns the automatic monitoring of word growth during circuit synthesis and the manipulation of word growth by the compiler or user during the process of adjusting numerical performance of the processor and its physical area. Growth above the binary point may then be available to the designer as information at any point in the circuit. No simulation is necessary.

QUANTISATION NOISE

A further aspect of the present invention concerns the problem of quantisation noise. This is the noise arising from the inherent inaccuracy with which a physical quantity is represented in digital form. The problem increases as the complexity of digital signal processors increases.

This aspect of the invention therefore concerns the management of quantisation noise during circuit synthesis and its subsequent manipulation by the user during the process of fine tuning of numerical performance and physical area. The intrusion of quantisation noise is then available to the designer as information at any point in the circuit. No simulation is necessary.

In particular, it is feasible to provide a static check which propagates a numerical representation of noise floor throughout the users schematic. The level of noise intrusion at any point in the network may be displayed.

This aspect of the invention is based on the fact that variances of random functions are additive; this is employed herein to simplify the estimation of noise floor. In particular, noise floor may be maintained throughout the system as a local attribute, as explained hereinafter. A signal may be modelled as a perfect real number augmented by quantisation noise and the assumption may be made that quantisation noise is uniformly distributed within the amplitude of the smallest bit representation of the number. Since variances of random numbers are additive, the square of the noise representation at each network node may be accummulated. As will be explained hereinafter, propagation of the noise floor throughout the network may be performed according to certain simple rules. The result is that the user is able to see the intrusion of quantisation noise during the design process without recourse to simulation.

ATTRIBUTE PROPAGATION

A further aspect of the present invention concerns the propagation of signal characteristics throughout the network of a processor which is realised with the aid of a compiler so as to achieve a synthesis which can be locally optimised and numerically consistent.

A compiler synthesizes circuits to implement a processor whose function may be described by a signal flow graph which specifies the flow of information carrying signals through operators that perform arithmetic functions. As mentioned hereinbefore, the format and structure of the signals are preferably determined by the requirements of throughput and dynamic range (i.e. accuracy) and have a direct impact on the hardware, that is to say the physical realisation of the processor, that is necessary to realise the arithmetic operators.

It is known practice to define signal structure and format for the entire system, i.e. globally. This constrains the processor synthesis to produce circuits that accommodate the worst cases for accuracy and dynamic range for every operator in the processor. This is unnecessarily pessimistic because, in reality, the requirement of dynamic range for signals varies throughout a network. Improved efficency is possible if the hardware can be realised to meet the minimum local requirements for accuracy and dynamic range.

This aspect of the present invention presumes that an input signal starts with a dynamic range defined by the sampling accuracy. The dynamic range required to preserve signal integrity may then be allowed to grow or shrink as it is transformed by the arithmetic operators. The amount of growth of dynamic range depends upon both the operations performed and on the characteristics of the signal. In order to allow calculation of the requirements of dynamic range for signals at any point in the network and to provide a system which accommodates overriding of the values computed by the system, there is provided a technique for propagating signal attributes describing the characteristics and value of each signal at any point in the network which is being synthesized.

It is known to provide an event driven simulator which propagates data through a network of logic gates. This aspect of the present invention is analagous to the operation of such a simulator but in the present invention the compiler propagates a set of attributes that characterise the physical and statistical properties of a signal. Each arithmetic operator is able, by examining the attributes of its input signals, to generate a new set of attributes describing the characteristics of its output signals. Initial attributes throughout the network may be calculated by propagating the initial input signal characteristics, as provided by the designer. The designer may override certain attributes of any point in the network and the system then calculates the effect of this alteration throughout the network by propagating the altered values.

In particular, the compiler may describe signal format, the information content of the signal word, in terms of format attributes. The attributes of 'point' and 'latency' describe respectively the precision in bits of a signal word and its location in time at any point in the network of a processor. The so called 'actors' in a digital signal processor by their nature transform these attributes while performing operations on a signal and users have the capability to adjust signal format by overriding those signal attributes at any point in the network. For proper operations such 'actors' require that input signals thereto have the same latency and that their binary points are aligned. In order to simplify the task of the user, allowing concentration on the adjustment of information content of critical points without regard to the consistency of signals, the compiler preferably provides for maintaining consistency of all input signals to any given actor.

Thus the system may examine the format attributes, provided by the attribute propagation system, of all input signals to a function. A set of rules may be applied to determine which of the inputs should be altered and which attribute should changed. The system therefore operates to preserve, so far as possible, the effect of earlier user overrides while using a minimum of hardware to perform the required signal transformations.

These and other aspects and objects of the invention will be described in more detail with reference to preferred implementations.

BRIEF DESCRIPTION OF THE DRAWINGS

FIGS. 5 to 8 illustrate various forms of an 'actor' representing a 6-bit serial multiplier.

DESCRIPTION OF PREFERRED IMPLEMENTATION

As indicated hereinbefore, a compiler according to the invention is generally intended for use in the design and realisation of a digital signal processor. The main characteristics of digital signal processing computation relative to general purpose computation are first the constraint to real time operation and second the comparatively simple structure of algorithms for digital signal processing. Such comparative simplicity of structure is offset from the designer's point of view by the often prodigious throughputs required. The large majority of high performance applications of digital signal processing do not require any modification or reconfiguration of the implementations desired but a machine which executes some fixed task at a very high rate. Usually the high performance required for digital signal processing is best met by extensive use of parallelism or pipelining. Many different operations can occur concurrently in a parallel/pipeline machine: once the pipeline is full, the machine can operate at maximum efficiency.

COMPONENTS OF THE COMPILER

Figure 1:
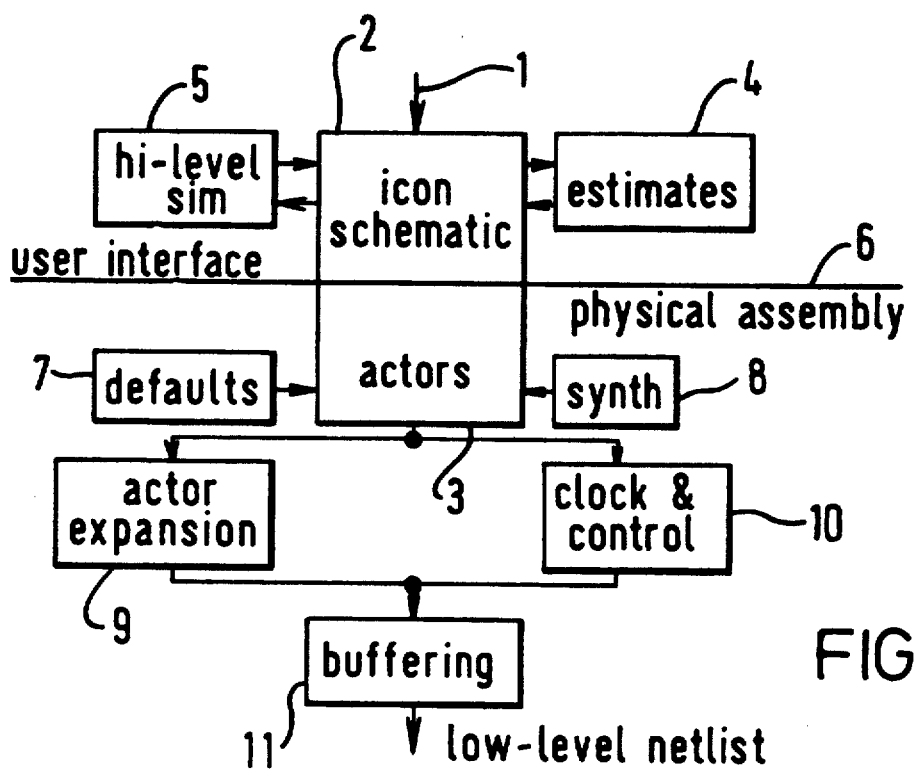
FIG. 1 illustrates schematically the main components of a compiler for a digital signal processor.

FIG. 1 of the drawings shows the general arrangement of a compiler for a digital signal processor which realizes a function specified by the designer in terms of an icon network.

Figure 2:
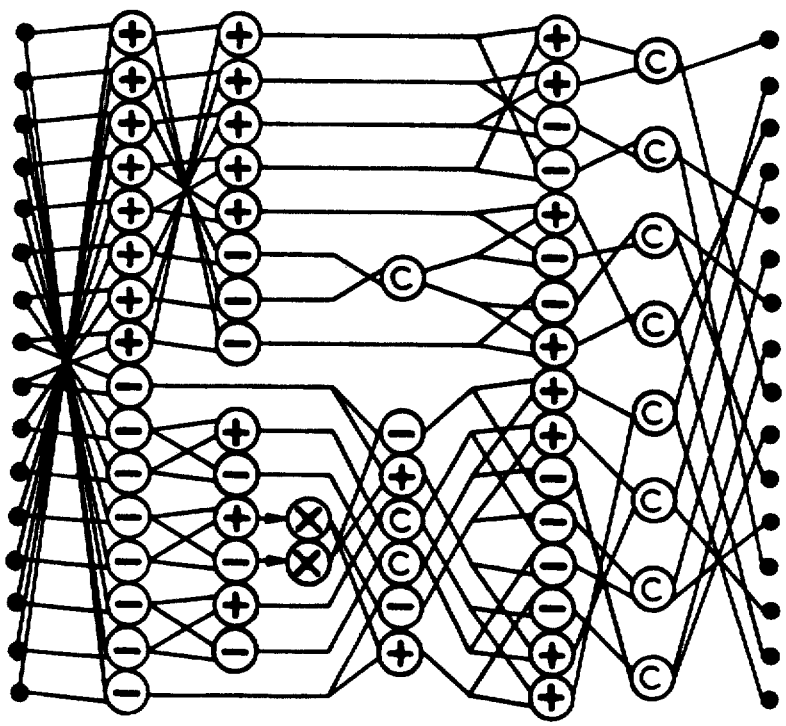
FIG. 2 is an icon schematic of a discrete cosine transform processor.

A user input is shown at 1. This consists of various controls, in known form, with which the user can specify in functional terms a digital signal processor. The user selects and manipulates on a display various 'icons' which represent various basic functions, such as addition, subtraction, rotation and multiplication, to form a network. One example of an icon network is shown in FIG. 2. The compiler is programmed so that associated with the icons are respective 'actors' 3. Examples of 'actors' are given later. An actor is the functional counterpart of an icon and the programme segment defining it provides not only the corresponding signal processing function but also acts on various signal attributes so that the compiler can provide throughout the network the values of those attributes as part of the design process. The icons may be regarded as performing actions on such attributes but the actor is the programmed means of accomplishing the function specified by the icon.

Each icon preferably has a default action on each attribute but in general a user may override the specified action to achieve a desired numerical effect. For example, the ordinary or default action of a multiplier on an attribute known as 'point' (the position of the binary point) is (preferably) to move the binary point upwards by an amount equal to the size of the coefficient word minus one bit. However, the action may be altered to vary, locally the dynamic range of the data. The compiler may automatically include extra actions at inputs to maintain consistency.

Two types of icons exist. The first is built into the compiler. These are primitive icons. The second type comprises user-defined icons. It is preferable to provide primitive icons only for the fundamental operations of multiplication, rotation, addition, subtraction and accumulation. It is desirable also to provide a 'null' icon for use in providing design consistency in certain cases. Each icon has a predictable effect on input attributes. For example, an adder must align both latency and binary points on its inputs. By this is meant that the signals to the adder must arrive at the same time and have the same position for their binary points.

User-defined icons are clusters of icons defined by the user and used for hierarchical specification. User-icons may also have predictable compound action and require consistent attributes on their inputs and outputs. As may be seen, the compiler may alter the attributes on the output to accompany this consistency, using worst case through-path analysis.

Also available to the user are displays 3 and 4 for estimates and high level simulation.

The interface between user and the programmed compiler is shown at 6. The schematic of the compiler includes stored default settings 7 for the actors, and the process of synthesizing 8 and automatic expansion 9 of actors (as will be illustrated later), the addition 10 of clock and control circuits and the addition of buffering 11. The processes of adding clock, control and buffering are not of importance to the invention and will not be described in detail. The output of the compiler (as previously indicated) is a low level netlist.

ATTRIBUTES

Attributes provide most of the descriptive power in the compiler. The preferred compiler includes a default system which assigns value to attributes and propagates any change selected by the user through the icon network. However, it is also possible to synthesize attributes from a minimal initial set supplied by a user.

Attributes can vary in scope. They may be local or global. 'Local' means local to a particular node. 'Global' refers to an attribute which is common to the entire system. Word attributes refer to the output or outputs of each primitive and there are two types. The types are related to structure and format. Basic attributes, which control arithmetic function, may vary from primitive to primitive.

AN ICON NETWORK

One example of an icon network is shown in FIG. 2. This represents a processor for a 16×16 discrete cosine transform for use at digital video rates (such as approximately 14 MHz). No attempt will be made to describe the function or interconnections of the processor in detail, in view of its great complexity. It may be understood by reference to J. A. Roese et al., "Interframe Cosine Transform Coding", Trans. IEEE COM-25 pages 1329 to 1339 (November 1977), and Jutand et al., "A single chip video rate 16×16 cosine transform "Proc. IEEE-IECEJ-ASJ-ICASSP (1986) pages 805-808. The transform is useful in image coding and compression.

This network is given by way of example only. The specification of function consists of selecting and manipulating displayed icons and their connections (as in known practice).

GRAIN SIZE

Once of the keys to successful architectural synthesis is grain size. The grain may be considered as the quantisation of the design space or alternatively as the physical level at which architectural manipulation occurs. The lower the grain size, the more closely technology dependent and application dependent parameters can be matched. It is possible to use NAND gates or, for example, 16×16 combinatorial multipliers as grains but it is preferred to employ a full adder. The user of NAND gates provides high efficiency but poor tractability. Synthesis using such a low grain size is described in "Logic Algorithms for VLSI Synthesis", R. K. Brayton et al., Kluwer Academic Publishers (1984).

The use of a 16×16 multiplier has more utility. Design of a system can evolve along data path lines. Data path architecture has a generality and versatility which can often be put to advantage, particularly in low performance applications. This architecture is almost universal in standard parts; essentially microprocessors enhanced by hardware multipliers. Operands are cycled sequentially through this large computational grain though it is difficult to maximise its use.

By choosing a full-adder computational 'grain' a high degree of architectural synthesis may be provided while silicon resources may be close enough to the requirements of each application. Broadly speaking, unit silicon area (the grain) is capable of x full adds per second given a fixed clock rate of x Hz. This is the technology specific component, decided by rise times, gate delays and suchlike, which can accurately characterised by tight control of pipelining. On the other hand a task requires y full adds per second. This figure can vary by 45 orders of magnitude between applications. y depends on function, throughput and accuracy. This is the 'application-specific' component.

The two quantities may be reconciled. The task requirements can be met in y/x silicon units. This ignores the cost of communication in and out of the processor cell and also assumes a continuous linear solution space. The key point is that the lower the grain size the more continuous is the space available for the solution. This has important ramifications in two respects: the efficient allocation and use of silicon and the ease of architectural synthesis.

Example of actors rendered in terms of full adders will be described with reference to FIGS. 5 to 8.

ARCHITECTURAL TEMPLATE

Figure 3:
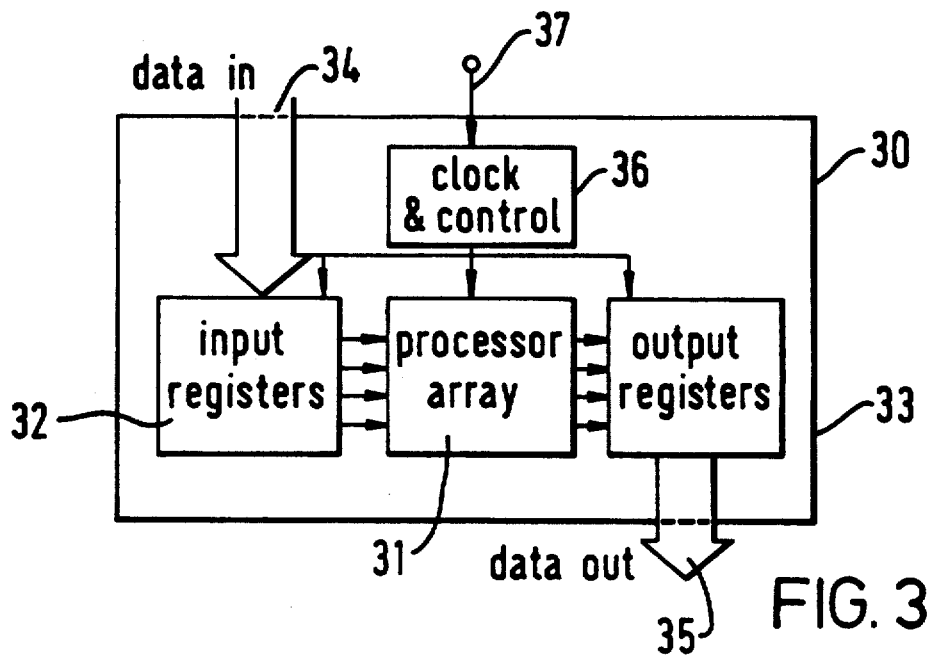
FIG. 3 illustrates an architectural template.

The compiler will realize any selected processor with the aid of an architectural template, of which a preferred version is shown in FIG. 3. The synthetic machine 30 (whatever its function) consists of a hard-wired pipeline processor array 31 and sets 32, 33 of registers for communication. The processor array is the realization of the icon network. According to the template, input data arrive in sequence on a bit-parallel bus 34 and load the input registers 32. When this process is complete, the data block is transferred into the serial domain and transmitted in pipelined fashion, according to the word structure described later, through the processor array 31. The input registers immediately start to refill with the operands for the next computation. Results are put into the output registers 33, are transferred back into the the parallel domain and depart from the output registers on the output bus 35. The scheme includes the necessary clock and control circuits 36 and a clock input 37.

The transfer between domains may be termed "corner-turning". This is used in the same sense as that employed in Denyer et al., VLSI Signal Processing—A Bit-Serial Approach, Addison-Wesley (1985). In the usual case where multipliers are programmable, as in the example given later, coefficients arrive in sequence on dedicated buses. As explained in "Serial-Data Computation", S. G. Smith & P. B. Denyer, Kluwer Academic Publishers (1988), multipliers may employ serial/parallel techniques and no forward transmission of coefficients is required once the coefficients are loaded.

Traffic in and out of a cell 30 fabricated according to such an architectural template is often heavy enough to warrant separate input and output buses or even multiple input and output buses. Because the external interface is not as critically timed as the processor array, some bit-parallel operations may be performed. These may include normalisation for block-floating point schemes, saturation addition or suchlike. Input generators and output compressors of pseudo-random sequences may also be included for self testing. These are not important for the present invention.

WORD ATTRIBUTES

By initially identifying and isolated a repeated computational step, or "task", one makes coarse decision about word-parallelism. Partitioning into small tasks produces a higher task-rate than a partitioning into larger tasks: although the processor performs fewer operations per task, it needs to perform more tasks per unit time to maintain the operation rate required. Thus word-parallelism can be compromised with bit-parallelism, according to how well structured the algorithm may be.

Once a task is identified, a task-rate is implicit. In turn this provides a budget in terms of local clock cycles for the task. This dictates the size of the internal working word, and that leads to the problem of processing a word of nd bits (where n repesents accuracy and d the number of digits) in d clock cycles; for this one needs a word structure that is matched to the (local) pipelining necessary to perform the task at the given rate.

The present technique provides a word structure which allows the freedom to specify separately the function, throughput and accuracy of the processor.

WORD STRUCTURE

A digital signal sample in the physical domain of a digital signal processor is a space-time distribution of digital bits on wires. A digital signal sample is treated herein as a word. A 'digit' is a cluster of 'bits', transmitted concurrently in a pipe. It will be understood that relationship of a pipe to a digit is analagous to a relationship of a wire to a bit. According to one aspect of the invention words are decomposed into three attributes, called herein bits, digits and subwords.

The term 'bits' is used to refer to the ratio bits/digit. The term 'digits' is in reality the ratio digits/sub-word. The quantity 'subword' is used to refer to the ratio subwords/word. The product of the three attributes is the length of the word in bits.

As used herein, bits and subwords have a spatial significance whereas digits have only a temporal significance. For example, a 30-bit word might consist of three subwords, each in turn consisting of five digits each of two bits. The 'bits' are transmitted concurrently but separated spatially. Digits are transmitted serially but separated temporally and subwords are transmitted in staggered fashion on multiple pipes, separated both spatially and temporally.

Figure 4:
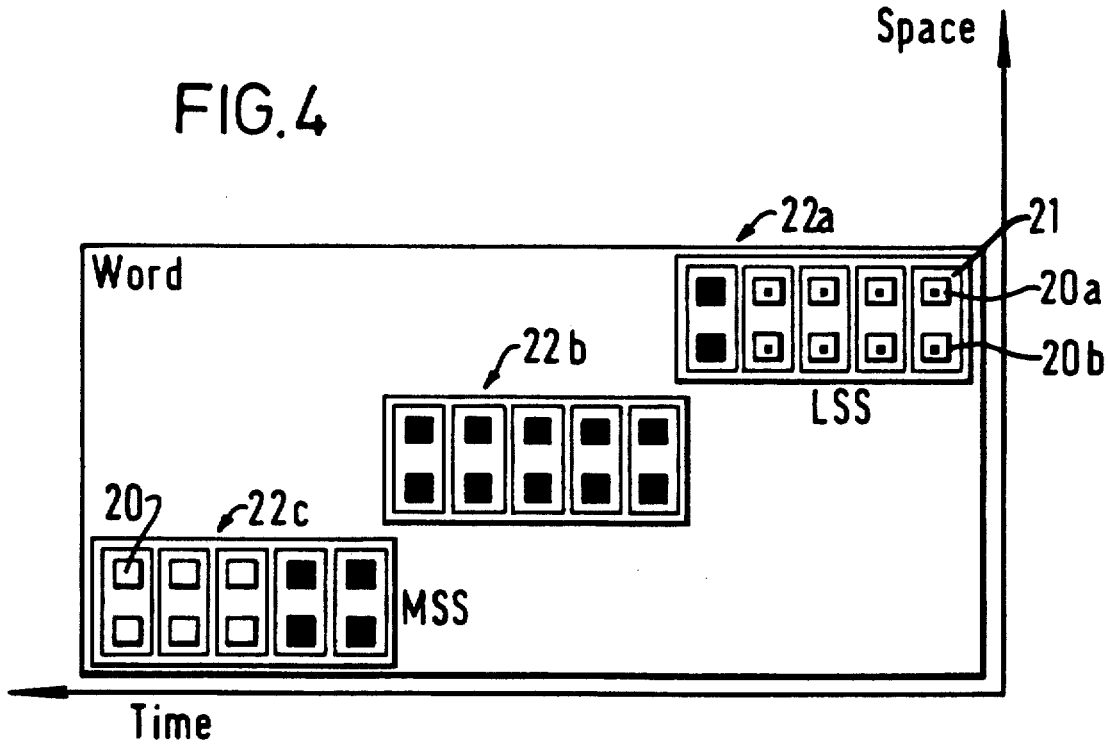
FIG. 4 illustrates schematically a preferred form of word structure for use in the compiler.

FIG. 4 illustrates the relationships in space and time between bits, digits and subwords. A bit is shown as a small square such as the square 20. Each digit such as digit 21 consists of two bits, a less significant bit 20a and a more significant bit 20b. Each subword such as the subwords 22a, 22b and 22c consists, as may be seen, of a selected plurality of digits. The subwords in FIG. 4 each consist of five digits each of two bits. In each subword the least significant digit is transmitted first. The subwords are separated spatially and are transmitted, in increasing order of significance, at staggered times on different pipes.

The parameters 'bits', 'digits' are global whereas the parameter 'subwords' is local. Accordingly, numerical headroom may be provided where needed. The number of 'bits' affects the maximum clock rate in any realisation because sum and carry ripple path lengths are proportional to this attribute. Bits and task rates together decide the maximum size of digits: there are a number of clock cycles per task, for any given application.

As well as a space-time decomposition, it is desirable to manipulate the information content of any branch in an icon network. Not all bits in a signal contain information. For example, head room may be provided by specifying a word length larger than necessary. In an addition operation, one bit growth is possible in general. Local attributes 'zero' and 'point' (referring respectively to the number of training zeros in a word and to the position of the binary point respectively) allow the exact specification of signal formats at icon outputs.

The all black bits in FIG. 4 denote the conditions wherein there are eight trailing zeroes and the 'point' is set at 24. This means that 16 bits of information are contained in a 30-bit word with eight trailing zeroes. These zeroes are shown dotted in FIG. 4. The word is transmitted according to the structure attributes described earlier. Each icon will transform format attributes in a simple manner and a default system will use these transformations to propagate attributes throughout the icon network. Information content may grow above the binary point; such growth may be estimated statistically but it is the ultimate responsibility of the designer to provide enough head room to avoid overflow.

A final format attribute is latency. This means the path length from input to output, measured in clock cycles. For example, an addition in its basic form increases latency by one clock cycle.

Icons may carry basic attributes. This effectively parameterises arithmetic functions. For example, a multiplier has an attribute describing the resolution of a coefficient: this is called hereinafter 'coefres'. If the coefficient is fixed function it has a value 'coefval'. This may be expressed as either a real number or as an integer, denoted by a further attribute 'coeftype'.

Estimation attributes are purely informational because the user cannot manipulate them directly. They track the consequences of actions and are reported by the compiler on request. Some estimation attributes are 'noise floor', which is an estimate of noise intrusion based on certain statistical assumptions and 'overflow', being an estimate as to the likelihood of overflow, also based on statistical assumptions.

Except as stated, the aforementioned attributes are local, i.e. they can vary from node to node in the icon network. Global attributes are consistent throughout the icon network. As mentioned, 'bits' and 'digits' are global attributes, because digit transmission is uniform throughout. Other global attributes include 'task rate', as defined earlier, and 'muxlevel' being the number of ways the processor is multiplexed or time shared.

Actions are the effect of icons on word attributes. They may be expressed as fundamental transforms. Each icon has a default action on each attribute, predefined by its own basic characteristics. A user can override these attributes and propagate the new attributes forward throughout the icon network.

Along with basic attributes, actions provide a mechanism for controlling numerical performance. A user may override an action on any icon, to achieve some desired numerical effect. For example, a multiplier's default action on 'point' is to increase it by the coefficient word size minus one bit. By decreasing the 'point' the user can make fewer product bits visible and decrease the local dynamic range, thereby economizing on the area of silicon employed. Extra actions may also be included by the compiler to maintain consistency.

Associated with each primitive icon is its functional counterpart which is termed its 'actor'. The actor is fully defined by the primitive and the associated attributes.

Actors may be specified according to local and global attributes. Although the mapping between icon and actor netlist is not trivial it need not normally concern the user. An actor performs arithmetic functions specified by the respective icon and its basic attributes. It includes the shifters and delays necessary to provide any change from the default actions. Clock, control schemes and buffers need to be included. The results of this stage is a netlist of standard cells (obtained from the library of the compiler) and instructions for their disposition and routing.

ESTIMATION OF WORD GROWTH

As mentioned hitherto, the possibility of numerical overflow due to word growth is always a problem in digital signal processing particularly when using fixed point number systems.

In this aspect of the invention growth may be maintained as the product of a user defined growth factor and the logarithm to the base two of a quantity RMAX which is propagated throughout the icon network.

The specification of a word growth factor is required because signal sample coherence tends to be application-specific and only the user knows what to expect. Growth factor may be entered by the user as a percentage value, between 0 and 100. Growth factor may be represented internally by the factor g which is equal to (100+growth factor)/200. Growth factor 100 represents coherent growth and 0 represents incoherent or random growth.

The quantity RMAX may be set at 1.0 at each input of the processor. It is preferably manipulated according to the following rules:

(1) The RMAX at each input of an adder or subtracter is added to produce the output growth factor.

(2) Programmable multipliers pass the growth factor untouched. This is effectively the worst case because we assume that the programmed coefficient value is maximal.

(3) Fixed multipliers multiply RMAX by their coefficient value raised to the power of 1/G. This exponentiation is effectively a normalisation step. Scalers may be treated in the same way.

From these rules, all growth factor manipulation may be deduced. For any point in the icon network one is able to display word growth above the binary point. Consequently the user is able to monitor the effect of word growth during the design process without recourse to simulation.

ESTIMATION OF QUANTISATION NOISE FLOOR

The object of estimation of quantisation of noise floor is to provide to the designer information on the intrusion of quantisation noise at any point in the circuit without necessitating simulation.

Noise floor may be maintained as a 'local' attribute. A signal may be modelled as a perfect real number augmented by quantisation noise. It may be assumed that quantisation noise is uniformly distributed within the amplitude of the smallest-bit representation of the number. One may use the fact that variances of random numbers are additive and thereby accumulate the square of noise representation at each network node. One may assume N-bit input data and that coefficients contain quantisation noise calculated as $2^{(-2N)}/3$. This follows directly from the statistics of uniform distributions. One may set the binary point immediately below the most significant bit of input data and propagate the local attribute according to the following rules:

(i) at adders or subtractors noise floors are added.

(ii) at programmable multipliers, the coefficient noise floor is added to the input noise floor.

(iii) at fixed multipliers, the error between the generated coefficient and the specified coefficient is squared and added to the input noise floor.

(iv) at downshifters, an extra noise floor component is calculated using the new position of the binary point as a reference.

Noise floor may be displayed in decibels down from the reference signal, which is a sinusoid which has grown according to the users growth guidelines. Thus the user is able to see the intrusion of quantisation noise process without recourse to simulation.

ATTRIBUTE CONSISTENCY

Attribute consistency has two aspects. The first is the consistency of an individual signal. The second is consistency of multiple signals. The two cases may be discussed separately although consistency of multiple signals must maintain the consistency of individual signals. In order to understand the following explanation the following terms should be understood:

(i) A word is represented as a number of bits. When referring to a word it is not necessary to think in terms of its time-space representation because a word can be split into an arbitrary number of time-space representations. A word can hold data which is also independent of the time-space distribution.

(ii) The least significant bit is used in a sense that the system operates on data which is passed through the system, the least significant bit first. Accordingly the arrival of the least significant bit, indicated by a control signal, is the indication that a new word has arrived.

(iii) Synthesis options are options which are supported by the system and which allow the user to control local attributes.

(iv) A primitive is one member of the set of basic building blocks that the system provides in order to build networks. Examples are multipliers and adders. Primitives are subject to consistency checking of consistency alignment based on the synthesis options that the user chooses.

Each signal is affected by the following global attributes which cannot be changed locally. They are 'bits', 'digits', the number of bits in a pipe and the working precision. The first two are as previously defined. The number of bits in pipe is equal to the number of bits multiplied by the number of digits. The working precision is the number of bits that the user believes is appropriate within the processor to provide the accuracy required.

Each signal has associated with it the following local attributes:

(a) 'Point'; this refers to the position of the binary point measured in bits from the bottom of the word.

(b) 'Growth'; this is stored internally as RMAX which can easily be converted to growth and represents, as noted in a previous section, the current word growth through the system accumulated to the current signal measured as a number of bits.

(c) 'Latency' refers to the number of internal clock cycles, measured from the output of the input corner turning registers, that it would take the least significant bit to get to that point in the system.

CONSISTENCY OF INDIVIDUAL SIGNALS

If a user overrides a signal or the inputs where signals are inserted from the corner turning registers, the following steps take place to maintain consistency for an individual signal.

(1) The maximum number of bits that can be used to represent a word is calculated. Various synthesis options control the actual number of bits that can available. If one operates on the default system then the number of bits available is the working precision. If the synthesis option 'grow to top of word' is used then in the case where the working precision is not a multiple of the 'number of bits in the pipe' then the extra bits in the pipe will made available to the processor. In the default system any extra bits that are not used permit the removal of unnecessary hardware. If a synthesis option 'adding subwords' is used then the system will allow the user to work locally at whatever precision is required. In this case there is no restriction on the number of available bits although there is a penalty of an increase in the area of substrate required to implement the structure.

(2) Whether there is enough space for the current value for point and growth is checked. If there is a restriction on the number of bits that can be used to represent the word, as noted above, and if the addition of point and growth exceeds that number then it is necessary to downshift the 'point' attributes. This means that bits must be lost from the bottom of the word so that one can store the "growth" number of bits above the point within the number of bits available.

(3) The number of subwords required must be calculated. This is the number of pipes that will be needed to hold the current word, as represented by 'point' and 'growth' in bits.

(4) If required, latency must be modified. If it is necessary to downshift the attribute 'point' to accommodate the current word then it is necessary to increase the latency of the signal because the downshift will represent real hardware in the final circuit. Latency is increased by the number of bits downshifted divided by the number of bits in a digit.

CONSISTENCY OF MULTIPLE SIGNALS

At various stages within the network the system will apply consistency rules to groups of signals in order to generate correct circuits at all times. The basic aim of multiple signal consistency or alignment is to align the 'point' attribute on incoming signals. This means adding extra hardware to shift the data to align the binary points before applying any operations to it while maintaining room for growth and expected growth and keeping any other dependent attributes such as (subwords and latency) correct.

The following stages are necessary to maintain consistency:

(1) One must find the 'point' value to align on. There are various synthesis options that effect this stage of the synthesis. One may align to the highest value of point or one may align to the lowest value of the point. We can choose to align to a point override where a user has gone into the system and locally set the value of 'point' on a signal. One can choose to ignore point overrides. One can choose to align on all the signals if we have multiple overrides or one can align only on the signals that have a point override.

Here are a few global options to illustrate this:

(a) Options: align highest, do not align on point override.
Signal A—point=6—no point override
Signal B—point=8—point override
Signal C—point=9—no point override
Aligned point=9

(b) options: align lowest, do not align on point override
Signal A—point=6—no point override
Signal B—point=8—point override
Signal C—point=9—no point override
Aligned point=6

(c) options: align highest, align on point override
Signal A—point=6—no point override
Signal B—point=8—point override
Signal C—point=9—no point override
Aligned point=8

(d) options: align highest, align on point override, align on any when there is conflict.
Signal A—point=6—point override
Signal B—point=8—point override
Signal C—point=9—no point override
Aligned point=9

(e) options: align highest, align on point override, do not align on any when there is conflict.
Signal A—point=6—point override
Signal B—point=8—point override
Signal C—point=9—no point override
Aligned point=8

(2) Then one must find the maximum growth that is needed to accommodate the aligned signal. This will either be the maximum growth on any of the inputs or it may be under some circumstances the worst-case growth of the signals at the outputs of the next primitive. This is so because one can calculate the growth through the primitives and it is necessary to allow room not only for the current growth but also for the increase in growth through a primitive. It is then necessary to check that the aligned value of the point plus the maximum growth is less than or equal to the maximum number of bits available. If there is not enough space then it would be necessary to downshift the aligned point until the worst case growth of any signal can be accommodated.

(3) The latency of each signal may be modified as described in the section above. Here it may be noted that depending upon the options that the user has chosen the aligned point may require shifting so that the effect of the point alignment may result in an increase or decrease in latency.

(4) Finally the required number of subwords is set based on the value of the. point' and the worst case growth, however it may be calculated.

EXAMPLE OF AN ACTOR

As described previously, the actor is the means by which the respective icon is generated in terms of the selected computational grain and in accordance with the pipelining required by the word.

A convenient example is a bit-serial programmable multiplier. By 'bit-serial' is meant that the number of bits (according to the word structure described earlier) is equal to unity.

The bit-serial programmable multiplier has two basic attributes, the number of bits in the coefficient representation (coefres) and the 'exponent' which is the scaling factor in the product. The latter is a new addition to the specification of a multiplier and allows other than fractional representation. It resembles appending a scalar actor to a fractional multiplier.

The default setting for 'coefres' is the user's input data size and the default setting for 'exponent' is zero.

ACTION OF THE MULTIPLIER ON THE ATTRIBUTES

In respect of growth, the multiplier will multiply the quantity RMAX by two raised to the power of the exponent (e) The 'point' will be upshifted by a quantity s which is equal to (coefres-1). The noise floor will accumulate a new component corresponding to $2^{(-2m)}/3$ where m is equal to coefres. The integer full product (full prod) will be equal to the data multiplied by the coefficient (represented in integer form).

The multiplier may also have lineup actions. In the case of fractional operation, 'point' is downshifted by the quantity s in bits. The noise floor will accumulate a new component corresponding to $2^{(-2p)}/3$, where p is the value of 'point' after the downshift. The integer output product is $[\text{fullprod} + 2^{(s+e-2)}/2^{(2+e-1)}]$.

The output actions concern the effect of override on 'point', 'noisefloor' and the output product. The 'point' override can bring 'point' anywhere in the range (-headroom) to 'oldpoint'+coefres-1. The other two attributes, noise floor and output product may be computed in the same way but the machine will employ the overall shift distance, namely the sum of the lineup and override. If there is no overall downshift, then there will be no rounding bit added to the product and no downshift component added to the noise floor.

The bit-serial multiplier generator creates several processing pipes. This number relates closely to the local attribute 'subwords' and is either equal to that attribute or greater than it. It may be greater because in some cases the local requirements for word space may exhaust the local headroom even if there is still headroom available externally. The extra pipes provide the extra workspace. A second feature required by the multiplier is the ability to treat the most significant bit of the data differently from the others. This arises because this bit has negative weighting so that the final partial product must be subtracted from the partial product sum.

It is now possible to describe the generation of the multiplier under various conditions.

A simple case is given when the attribute 'subwords' is equal to unity and the 'headroom' is greater than or equal to one fewer than the coefficient resolution. This corresponds to a flush multiplier which contains no extra pipe and no special hardware for treatment of the most significant bit of the data. Such is shown in FIG. 5.

The flush multiplier 50 consists of a linear array of stages of hardware, which are almost identical. The number of stages is equal to the coefficient resolution, in this example, six (bits). This array is called the 'carry-save add-shift array' and the stages 51a-51f are each composed of a computational grain, i.e. a latched full adder. A coefficient bit is associated with each stage and the coefficient word is loaded into a bit-parallel register at the start of each product computation, being made available on lines 52a to 52f. Data is broadcast in bit-serial fashion, the least significant bit first, on line 53. The arrival of the least significant bit is signalled on line 54. If the data flow is regarded as occurring from left to right as shown in FIG. 5, then the most significant bit of the coefficient is stored at the left (line 52f) and the least significant bit at the right of the array (line 52a). Central to each stage is the carry-save adder which adds the new bit product, namely the product of the data bit with a coefficient bit, to the partial product sum, namely the sum of the shifted partial products to date, from the upstream neighbour. Thus for every clock cycle the array adds the partial product, generated by the new data bit and the static coefficient word, to the partial product sum.

Each carry-save adder has both its outputs, the sum output 55 and carry output 56, latched. Its inputs are gated, the purpose of the gating being, in two of the three examples, for upshifting and in the other case for the formation of the bit product. Upshifting is required for consistency of internal 'point'. The carry input must be given double weight and also so must be the partial product sum, because this is the way in which different weights are imparted to coefficient bits.

The shifters may be implemented in general by MUX gates 59, selecting logical zero at the time of the least significant bit. The bit products are provided by the AND gates 57a to 57f, each connected to the data input and a respective bit of the coefficient.

The most significant stage 51f is slightly different because it has no upstream neighbour to which it can be connected. This free input is used to perform sign extension of the partial product sum and thereby to give the most significant bit of the coefficient the negative weight. Accordingly the sum output from the most significant stage is recirculated back into the input for the partial product sum. An alternative implementation, where 51f is a subtracter, makes the free input available.

The least significant stage 51a produces the output product on a line 58. This output may be buffered.

The structure as described produces a full precision output as if the lineup action had been overridden. This structure upshifts 'point' by s bits, where s=coefres-1. In general there will be some combination of lineup and override which causes the full precision product to be reformatted, namely downshifted by some amount. This may be achieved by appending a downshifter to the carry-save add-shift array and inserting a rounding bit in the appropriate point, which maintains a zero-mean truncation error from the downshifting process.

A downshifter in the bit-serial case is a multiplexing latch which passes all but the bottom x bits of the word. Instead, the most significant bit of the previous word is repeated the same number of times. A rounding bit is inserted in one of the free inputs, namely the MUX gate which inserts a logical zero for the up-shift at either sum or carry input, at the stage (x-1) positions from the right hand end of the array.

FIG. 6 illustrates what happens when input headroom is decreased so that headroom <(coefres-1). It may be seen that the full precision product is now greater than 'digits', which is equal to 'pipe-size' for bit-serial operation. This requires an extra pipe internally for formation and possibly an extra output pipe should more than the pipe size product bits be required externally.

Now the 'flush' property, wherein all product bits appear at the end of the array and the effect of incorrect interpretation of the most significant bit does not reach the output, is no longer true and it is now necessary to include hardware for the treatment of the most significant bit of the data. This hardware is only required as far back in the array as is necessary to propagate the correct high-order bits in the product of the output. The flush property is not totally lost; every remaining bit of headroom allows a flush stage to remain Two actions are required. The first is to handle the growth of the product beyond the pipe size (thereby requiring an extra pipe). The second is to interpret the most significant bit of the data correctly where necessary. The addition of this hardware goes backwards down the array as far as is necessary to cause the correct generation of product bits.

The extra pipe is required because the original pipe is unable to complete the computation of the product. After a number of cycles equal to (digits−headroom) that is to say when the sign-extensions start to appear, all the partial products have been generated and added to the partial product sum. However only the quantity (digits−headroom) of the (digit−headroom+coefres-1) full product bits have been generated at this stage in the computation. The remainder of the product is in residual carry-save form, distributed throughout the array. The flush multiplier, having a guaranteed headroom, flushes these product bits out serially. However, it is now not possible to accomplish this because the full product is bigger than the pipe size. The new pipe is required to receive the remaining carry-save bit pairs and to clock these bit pairs through a bit-serial 'residue' adder to form the remainder of the product. FIG. 6 illustrates the modified form of the multiplier. The multiplier 60 generally resembles the multiplier 50 but has a new pipe which consists of a number of stages of parallel-load shift register 61 and a residue adder 62. There is no additional hardware required for partial product formation or partial product sum addition because all the work is done in the low order pipe.

A similar number of stages (in this case, two) in the original array are (automatically) modified with the insertion of an exclusive OR gate between the respective one of the bit product forming AND gate (52b and 52c) and the respective carry-save adder. This gate acts as a programmable inverter, which inverts the most significant bit of the data when instructed by a control signal. This actually one-complements the most significant partial product. Proper two-complementing requires the insertion of a '1' at the least significant end of the partial product. By the insertion of the exclusive OR gates 63 and the insertion (by way of latched inverter 64) of the inverted least significant bit product of the most significant partial product to the free input of the residue adder 62, the effect is the same.

A new control for the most significant bit is required. The most significant bit control is identical to that for the least significant bit except that it comes one cycle earlier.

FIG. 6 accordingly represents the hardware generated when the 6-bit multiplier has three bits of headroom and a shift of one bit.

FIG. 7 illustrates the case where headroom decreases to zero and the pipelining represented by the shift register 61 and the adder 62 has to extend back for all the stages of the multiplier. Since this multiplier 70 is now fully pipelined, there are two data outputs 58 and 58a from the final adder 51a and the residue adder 62 respectively. The latched multiplexer 68 is a downshifter which re-formats the product back to single precision fractional form, under stream. control as shown.

Figure 8:
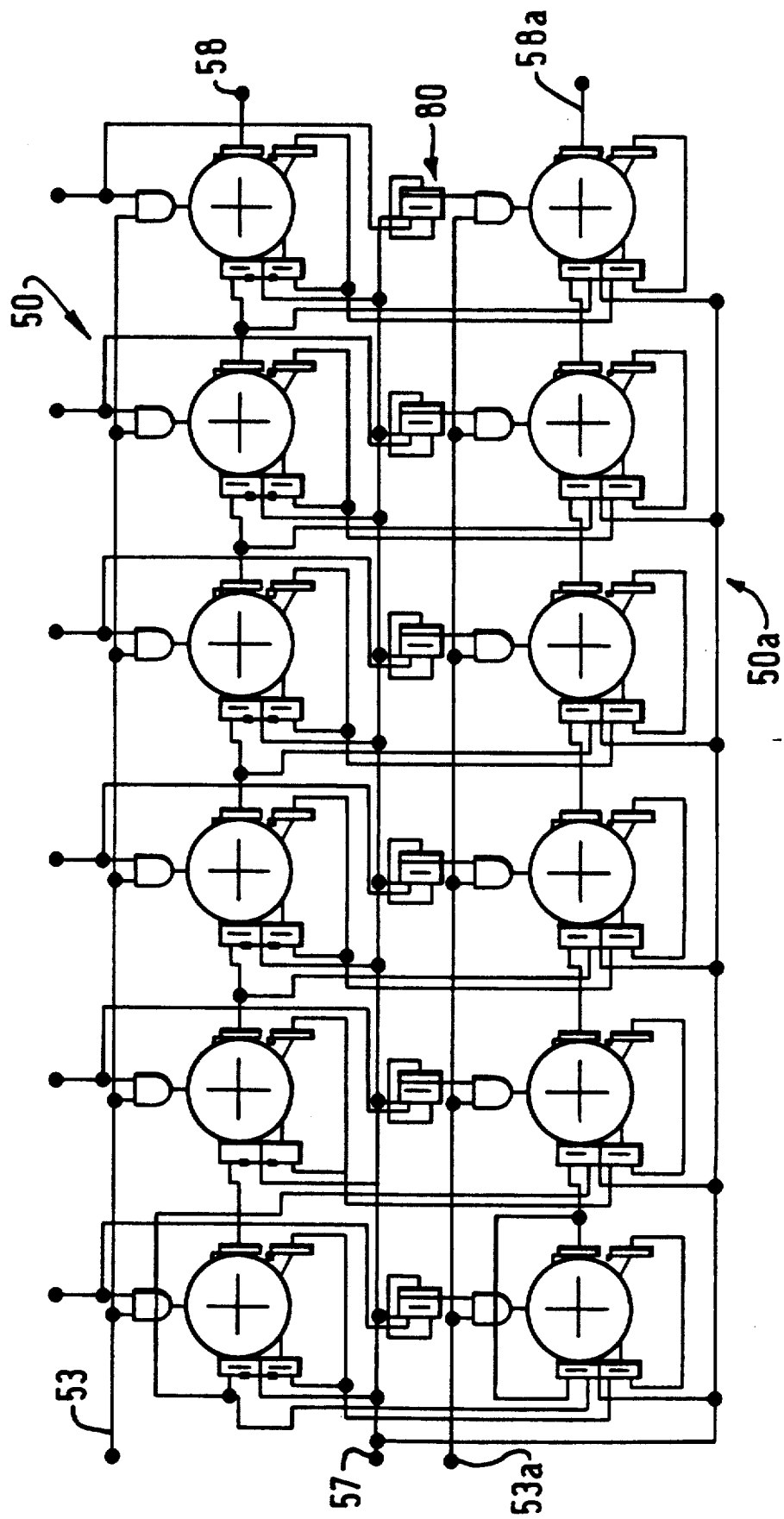

Finally, one may consider as shown in FIG. 8 the case where 'subwords' is equal to two. Because the input data now comes in on two pipelines (53 and 53a) two carry-save-add-shift arrays are required to cope with the traffic requirements of the partial product. The first pipe size partial products may be computed and the first pipe size bits of the product may be output from the first array. Here flush structure suffices. It will be observed that the top pipe (50) of FIG. 8 corresponds to the flush multiplier of FIG. 5. The upper pipe has data input line 53 and output line 58 whereas the lower pipe 50a has data input line 53a and output line 58a. The pipes have a common least significant bit control line 57.

At the end of the task period, namely after the number of cycles corresponding to the number of digits, the sum and carry residues and the coefficient are passed by way of gates 80 from the upper pipe 50 to the next pipe 50a. The sum and carry residues are fed to the equivalent free input while the 'coefficient' goes to the register as usual. The second pipe completes the product computation using whatever hardware is dictated by the attribute 'headroom' in identical fashion to that described earlier. It is obvious that the structure can be generalized to a multiplicity of subwords.

A SPECIFIC EXAMPLE

In order to illustrate the architectural techniques one may consider the design of a particular chip. The example chosen is the discrete cosine transform processor described earlier. When operating at 14.32 MHz, a 16×16 digital cosine transform requires some 80 million multiplications per second and as realised may perform almost 15 billion carry-save additions per second.

Figure 9:
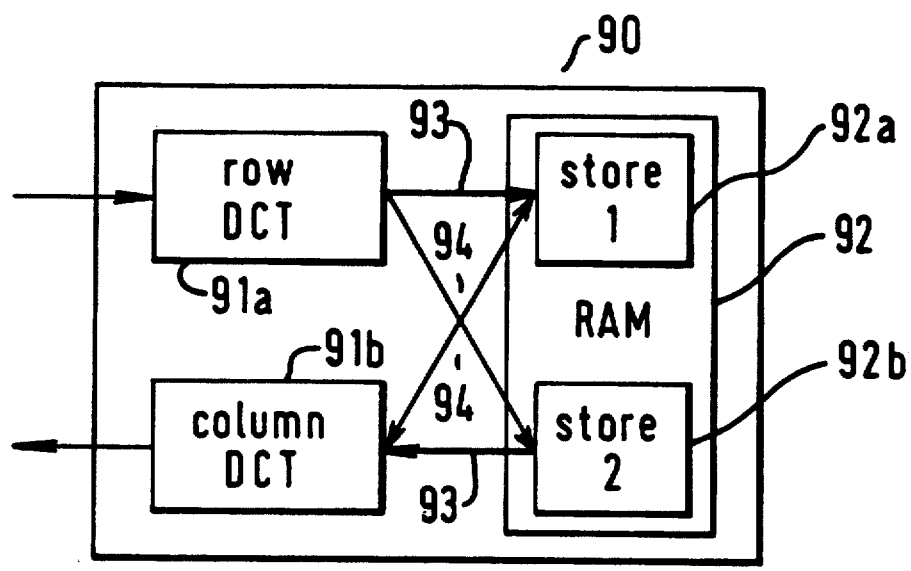
FIG. 9 illustrates the plan of a high level processor which may be realised employing the compiler.

The processor is intended to perform a 16×16 digital cosine transform on incoming 12 bit data where data resolution may be less than 12 bit. This data is assumed to be partitioned into blocks of 256 samples each representing a two dimensional sub-image of 16×16 12-bit pixels arranged in continuous rows. Included on board is a 256×12 bit RAM for storage of intermediate results and transposition. The memory is configured as two 16×16-word virtual stores. The processor writes, in rows, the 12-bit results of the digital cosine transforms to one store while alternately reading in columns intermediate results of previous sixteen now tranforms from the other store. When the 'write' store is full, the two stores exchange roles. The intermediate results are again subjected to sixteen 16-point one-dimensional digital cosine transforms to give the transform output arranged in contiguous columns of 12-bit precision. FIG. 9 depicts a high level plan of the digital cosine transform processor, comprising in effect a row transform 91a, a column transform 91b and two stores 92a, 92b. Heavy lines 93 between the processor and the random access memories represent one storage function. The light lines 94 represent the other storage functions.

Figure 10:
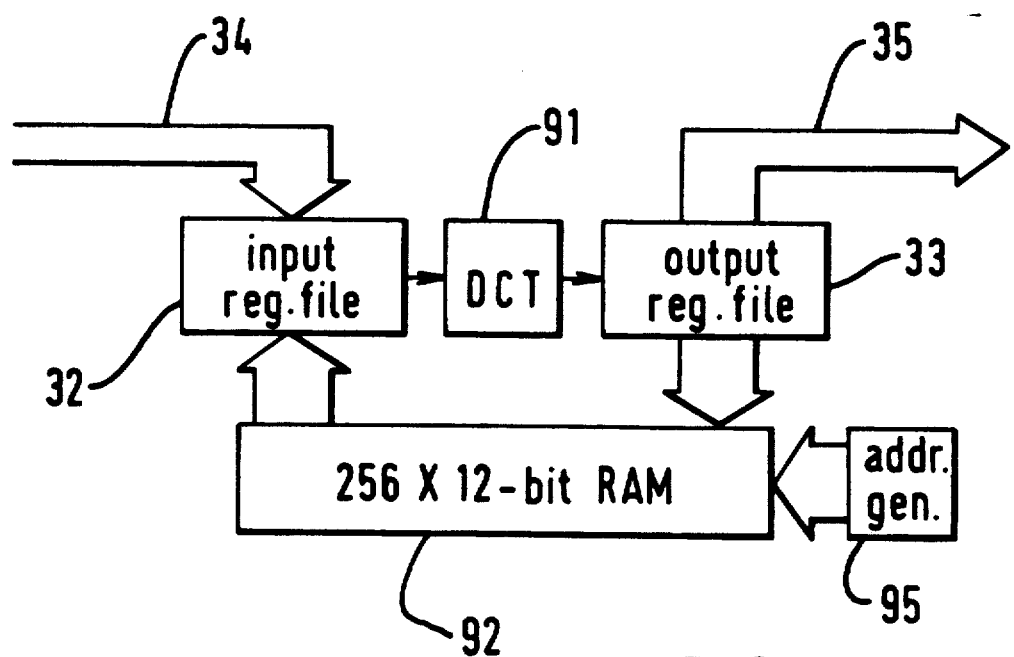
FIG. 10 illustrates the architecture of the processor.

The processing may be realised as a dedicated bit-serial flow graph which is time-division multiplexed between row and column transforms: the two processors (91a, 91b) in FIG. 9 are in reality one processor. The architecture is shown in FIG. 10, which resembles FIG. 3, in that it has an input bit-parallel bus 34, an output bus 35, input register files 32, output register files 33 and the processor (DCT) array 91, in this example augmented by a RAM 92 comprising the stores 92a and 92b. The memory 92 would have a (conventional) address generator 95. The input to the processor comes from 2×16-D corner turning register files 32, which are loaded in bit-parallel word-serial fashion with the operands for future one dimensional transforms, while unloading the operands for the current one dimensional transform in bit-serial word-parallel fashion. One register file is loaded from the external input bus and the other from memory in out-of-phase fashion. When one is full the other is half full. Results may be output in analogous fashion to memory and to the outside.

The DCT processor 91 (corresponding to the icon network of FIG. 2) may be realised in 1.5 micron CMOS technology using standard cells for all processor, interface and control functions. Memory 92 may be realised via a static RAM compiler. The die size would be approximately 350 mils (8.75 mm) square. The gate count apart from the memory would be approximately 21,500 of which approximately 12,500 comprises a processor array.

Despite its apparent complexity the processor section of such a machine readily adapts to the scheme described earlier: it may be completely specified by a flow graph of simple icons which carry attributes. Global attributes are as follows. The task rate equals 0.89 (MHz). The block size is equal to 16. Bits are equal to 1. Digits are equal to 22. The subwords are equal to 1. In this case this attribute is global. The MUX level equals 2. Accordingly it is a bit serial machine operating on 16-D blocks on 22 bit data multiplexed two ways into rows and columns.

One may commence with a predefined task rate and take the icon network directly from Jutand et al. mentioned previously.

The initial propagation of default attributes may commenced by the format specification of input data. The binary point may be positioned at bit position 12 and the number of trailing zeros may be 0. The parameter 'digits' is fixed at 22 in advance according to the the specification of accuracy. This means that initial hardware would be working on sign extensions for a considerable portion of the task period. At the earliest opportunity one may take the opportunity to upshift the binary point to 20 bits thereby making use of the considerable 'headroom' available. This can be accomplished by overriding a default point transform from the multiplier bank, changing it from 0 to 8.

A second override is the increase of the resolution of the last multiplier bank from 8 to 12 bits. This increases accuracy and extends the latency of the processor to 22 bits. The latter phenomenon simplifies corner turnings because input and output transfers are simultaneous. A final override may be at the processor output where the number of zeros may be specified as 10. This effectively discards 10 least significant bits out of 22, so as that only 12 of the most significant bits need corner-turned out of the cell.

Accordingly only three departures from default settings allow the exact specification of this processor.

We claim:

1. In a method of generating a digital signal processor by means of a programmed compiler, the steps comprising:

displaying by means of the compiler and under the control of a human user a network composed of a multiplicity of user-selected interconnected icons functionally representing the processor, said icon symbolically representing operational functions of the said digital signal processor;

storing in said compiler for each icon a respective functional actor in the form of a program segment providing a signal processing function corresponding to the operational function represented by the associated icon;

predefining within said compiler a multiplicity of signal format attributes relating to the accuracy of representation of a signal throughout the network, at least one of said attributes being capable of local variation within the network;

computing in said compiler values of said attributes at a multiplicity of points throughout the icon network, in accordance with the effects of the said actors on said attributes;

computing in said compiler for each of the actors a specific circuit implementation having a computational grain structure predetermined within the compiler, in accordance with values of said attributes at each of the said multiplicity of points of the network; and creating a netlist from which said digital processor may be generated as the specific circuit implementations of the actors.

2. A method according to claim 1 wherein some of said attributes are global to said network.

3. A method according to claim 2 wherein said compiler determines for at least one of said local attributes a default setting at at least one location in the icon network and the method includes the further steps of:

overriding under control of the operator said one local attribute at said at least one location of the icon network to provide an override value; and wherein said step of computing values includes computing same in accordance with the said override value.

4. A method according to claim 3 further comprising the step of automatically enforcing consistency of said one local attribute at points connected to the said one location by more than one route in the icon network.

5. A method according to claim 4 wherein said one attribute represents the position of a binary point and wherein said attributes include a locally variable attribute relating to the number of subwords in a digital word, said step of computing for each of the actors including varying said locally variable subword attribute and providing pipelining in accordance therewith.

6. A method according to claim 1 further comprising computing in said compiler a value of a signal estimation attribute for each of a multiplicity of points throughout the icon network in accordance with the functional effect of respective actors on said signal estimation attribute; and displaying said value of the signal estimation attribute for user-selected points in the network.

7. A method according to claim 6 wherein said estimation attribute represents noise floor.

8. A method according to claim 6 wherein said estimation attribute represents word growth.

9. A method according to claim 1 wherein one of said format attributes represents the precision in bits of a signal word.

10. A method according to claim 9 wherein another of said format attributes represents the time in clock cycles for a signal to reach a given point in the network from an input thereof.

11. A method according to claim 1 in which said signal format attributes comprise a first number representing bits in a digit, a second number representing digits in a subword and a third number representing subwords in a digit word, wherein the first and second numbers are invariant throughout the network and the third number can vary locally throughout the network and wherein the step of computing for each of the includes the provision of signal pipelines to at least the corresponding local value of the third number.

12. A method according to claim 1 wherein the said computational grain is a latched full adder.

13. In a method of generating a digital signal processor by means of a programmed compiler, the steps comprising:

displaying by means of the compiler and under the control of a human user a network composed of a multiplicity of user-selected interconnected icons functionally representing the processor, said icons symbolically representing operational functions of the said digital signal processor;

storing in said compiler for each icon a respective functional actor in the form of a program segment providing a signal processing function corresponding to the operational function represented by the associated icon;

predefining within said compiler a multiplicity of signal format attributes which relate to the accuracy of representation of a signal within the network and which can vary within the network;

computing in said compiler for each of the actors a specific circuit implementation having a computational grain predetermined within the compiler;

computing in said compiler the values of said signal estimation attributes for a multiplicity of points throughout the icon network in accordance with the functional effect of respective actors on said signal estimation attributes; and displaying at least one of said values of said signal estimation attributes for said at least one of said multiplicity of points.

14. A method according to claim 13 wherein said signal estimation attributes include a noise floor attribute.

15. A method according to claim 14 and comprising representing signals and coefficients in the form of real numbers augmented by augmentation noise, said quantisation noise being computed as $2^{(-2N)}/3$, where N is the bit length of input data, and representing noise floor at each point of the icon network as the square of the said quantisation noise.

16. A method according to claim 15 wherein said step of computing comprises:

adding noise floors at adders and subtractors;

adding at a predetermined multiplier the noise floor of the input signal to the multiplier to the noise floor of the multiplying coefficient of the multiplier;

generating at a fixed multiplier an error between a generated coefficient and a specified coefficient, squaring said error and adding the squared error to the noise floor of the input signal to the multiplier; and computing at a down shifter an extra noise floor component using the shifted position of the binary point.

17. A method according to claim 13 wherein said attributes include word growth defining growth above the binary point.

18. A method according to claim 17 wherein said step of computing values of said signal estimation attributes comprises:

maintaining the word growth attribute in accord with the product of a selected growth factor and the logarithm to the base two of a growth quantity;

setting said growth quantity to a value corresponding to unity at each input of the processor; adding the growth quantities for each input of an adder or subtractor;

passing a growth quantity unchanged through a programmable multiplier; and multiplying growth quantity at a fixed multiplier by the coefficient of the fixed multiplier raised to the power of 1/G wherein G is said selected growth factor.

19. In a method of generating a digital signal processor by means of a programmed computer, the steps comprising:

displaying by means of the compiler and under the control of a human user a network composed of a multiplicity of user-selected interconnected icons functionally representing the processor, said icons symbolically representing operational functions of the said digital signal processor;

storing in said compiler for each icon a respective functional actor in the form of a program segment providing a signal processing function corresponding to the operational function represented by the associated icon;

specifying, by means of the said compiler, for the said processor in accordance with a user-selected accuracy of binary representation of input signals and a user-selected task rate, a word structure having global attributes of number of bits in a digit and the number of digits in a subword and a local attribute which can vary from icon to icon of number of subwords, wherein the product of said numbers is the number of bits in a digital word in accordance with the selected accuracy; and computing in said compiler for each of the actors a specific circuit implementation in accordance with the respective values of said attributes, the step of computing including providing pipelines in accordance with a local value of the subword attribute; and creating a netlist from which said digital processor may be generated as the specific circuit implementation of the actors.

20. In a method of realizing a digital signal processor by means of a programmed computer, the steps comprising:

displaying by means of the compiler and under the control of a human user a network composed of a multiplicity of user-selected interconnected icons functionally representing the processor, said icons symbolically representing operational functions of the said digital signal processor;

storing in said compiler for each icon a respective functional actor in the from of a program segment providing a signal processing function corresponding to the operational function represented by the associated icon;

specifying, by means of the compiler, for said processor in accordance with a user-selected accuracy of binary representation of signals and a user-selected accuracy of binary representation of signals and a user-selected task rate, a word structure having global attributes of number of bits in a digit and the number of digits in a subword and a local attribute which can vary from icon to icon of number of subwords, wherein the product of said numbers is the number of bits in a digital word in accordance with the selected accuracy and a local attribute relating to position of a binary point in a word; computing in said compiler values for said local attribute for a multiplicity of points throughout the network, said step of computing values including enforcing mutual consistency of concurrent multiple signals in respect of the binary point attribute and in response to the enforcing step, varying the subword attribute; and computing in said compiler a specific circuit implementation for each of the actors in accordance with the respective values of said attributes, the step of computing a specific circuit implementation including providing pipelines in accordance with a local value of the subword attribute; and creating a netlist from which said digital processor may be generated as the specific circuit implementations of the actors.

21. In a method of generating a digital signal processor by means of a programmed computer, the steps comprising:

displaying by means of the computer under the control of a human user a network composed of a multiplicity of interconnected icons functionally representing the processor, said icons symbolically representing operational functions of the said digital signal processor;

storing in said computer for each icon a respective functional actor in the form of a program segment providing a signal processing function corresponding to the operational function represented by the associated icon;

specifying by means of the computer for the digital signal processor by means of the compiler a word structure having global attributes of number of bits in a digital and the number of digits in a subword and a local attribute, which can vary from icon to icon, of number of subwords, wherein the product of said numbers is the number of bits in a digital word in accordance with a user-selected accuracy of representation, and specifying by means of the computer a local attribute relating to position of a binary point in a word;

computing in said computer values for said local attributes for a multiplicity of points throughout the network, said step of computing including: enforcing consistency of concurrent multiple signals in respect of the binary point attribute and in response to the enforcing step, varying the subword attribute;

computing in said computer a specific circuit implementation for each of the actors in accordance with the respective values of said attributes, the latter step of computing including providing pipelines in accordance with the value of the subword attribute; and creating a netlist from which said digital processor may be generated as the specific circuit implementation of the actors.

* * * * *